US010115683B2

United States Patent
Tong et al.

(10) Patent No.: US 10,115,683 B2
(45) Date of Patent: Oct. 30, 2018

(54) ELECTROSTATIC DISCHARGE PROTECTION FOR ANTENNA USING VIAS

(71) Applicant: Freescale Semiconductor, Inc., Austin, TX (US)

(72) Inventors: Ziqiang Tong, Ottobrunn (DE); Ralf D. Reuter, Munich (DE)

(73) Assignee: NXP USA, Inc., Austin, TX (US)

( * ) Notice: Subject to any disclaimer, the term of this patent is extended or adjusted under 35 U.S.C. 154(b) by 58 days.

(21) Appl. No.: 15/099,309

(22) Filed: Apr. 14, 2016

(65) Prior Publication Data

US 2017/0301636 A1    Oct. 19, 2017

(51) Int. Cl.
*H01Q 1/38* (2006.01)
*H01L 23/60* (2006.01)
*H05K 1/02* (2006.01)
*H01L 23/66* (2006.01)
*H01L 23/528* (2006.01)
*H01L 23/522* (2006.01)
*H01Q 1/22* (2006.01)
*H01Q 9/04* (2006.01)

(52) U.S. Cl.
CPC .......... *H01L 23/60* (2013.01); *H01L 23/5226* (2013.01); *H01L 23/5286* (2013.01); *H01L 23/66* (2013.01); *H01Q 1/2283* (2013.01); *H01Q 9/0421* (2013.01); *H05K 1/0259* (2013.01); *H01L 2223/6616* (2013.01); *H01L 2223/6677* (2013.01); *H05K 2201/10098* (2013.01)

(58) Field of Classification Search
CPC .......... A61G 17/08; H01Q 1/243; H01Q 1/38; H01Q 5/371; H01Q 9/04; H01Q 9/0421
See application file for complete search history.

(56) References Cited

U.S. PATENT DOCUMENTS

| | | | | |
|---|---|---|---|---|
| 4,379,296 A * | 4/1983 | Farrar | ................... | H01Q 3/247 343/700 MS |
| 4,386,357 A * | 5/1983 | Patton | .................. | H01Q 9/0442 343/700 MS |
| 4,547,779 A * | 10/1985 | Sanford | ............... | H01Q 21/205 343/700 MS |
| 4,575,725 A * | 3/1986 | Tresselt | ............... | H01Q 9/0414 343/700 MS |
| 4,751,513 A * | 6/1988 | Daryoush | .............. | H01Q 1/247 343/700 MS |
| 5,220,334 A * | 6/1993 | Raguenet | ............... | H01Q 1/362 343/700 MS |
| 5,767,810 A * | 6/1998 | Hagiwara | ............ | H01Q 9/0421 343/700 MS |
| 6,501,427 B1 * | 12/2002 | Lilly | ........................ | H01Q 1/38 333/33 |
| 2002/0175871 A1 * | 11/2002 | Johansson | ............ | H01Q 9/0414 343/746 |
| 2012/0162834 A1 | 6/2012 | Yehezkely | | |

* cited by examiner

*Primary Examiner* — Tho G Phan

(57) ABSTRACT

An integrated circuit device is formed to include a plurality of vias that connect an antenna to a ground reference. This configuration of the integrated circuit device provides an electrical path from the antenna to ground, thereby preventing the buildup of charge at the antenna. The vias thereby reduce the likelihood of a potential difference between components of the integrated circuit device and the antenna, in turn reducing the likelihood of electrostatic discharge at the integrated circuit device.

11 Claims, 3 Drawing Sheets

ELECTROSTATIC DISCHARGE PROTECTION FOR ANTENNA USING VIAS

BACKGROUND

Field of the Disclosure

The present disclosure relates generally to antennas and more particular to electrostatic discharge (ESD) protection for integrated circuits including antennas.

Description of the Related Art

Antennas incorporated in or mounted on a semiconductor substrate are used in a wide variety of electronic devices such as personal computers, game consoles, smartphones, and the like. However, the presence of an antenna in an electronic device can exacerbate the problem of electrostatic discharge (ESD), wherein a buildup in the potential difference between the antenna and a component of a circuit incorporated in the semiconductors substrate can cause a sudden flow of current between the antenna and the component. ESD can degrade the performance of an integrated circuit, such as a monolithic microwave integrated circuit (MMIC) connected to the antenna, and in cases of high ESD current can cause permanent damage to the integrated circuit itself.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-5 illustrate techniques for reducing the likelihood of electrostatic discharge (ESD) at an integrated circuit device having an antenna. The integrated circuit device is formed to include a plurality of vias that connect the antenna to a ground reference. This configuration of the integrated circuit device provides an electrical path from the antenna to ground, thereby preventing the buildup of charge at the antenna. The vias thereby reduce the likelihood of a potential difference between components of the integrated circuit device and the antenna, in turn reducing the likelihood of ESD.

Figure 1:
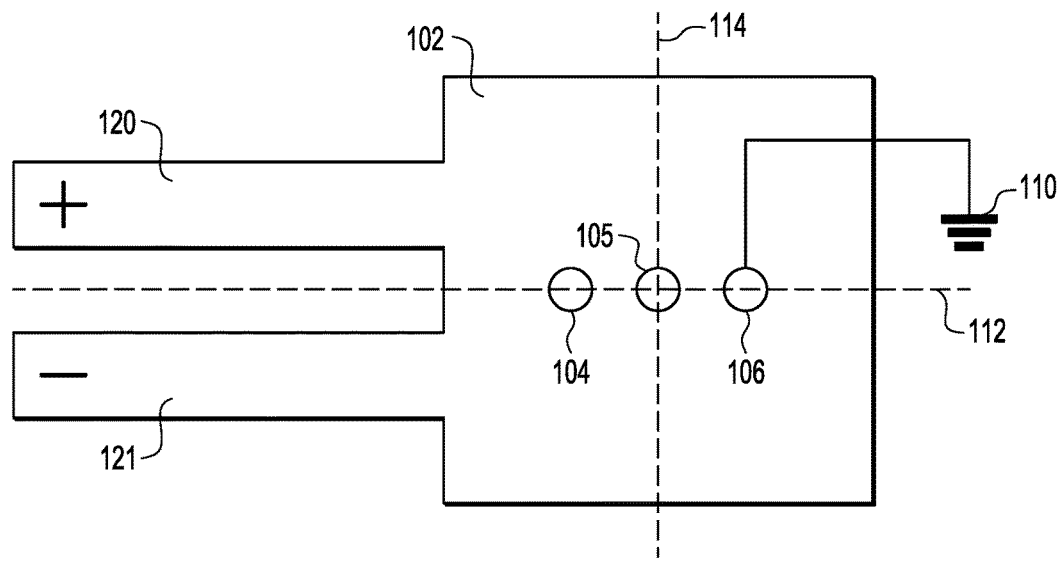
FIG. 1 is a block diagram of an antenna device including a plurality of vias connecting a patch antenna to a ground reference to reduce the likelihood of ESD in accordance with at least one embodiment.

FIG. 1 illustrates a block diagram of top view of an antenna device 100. The antenna device 100 may be incorporated into any of a variety of electronic devices, such as a computer, game console, smartphone, tablet, and the like. In at least one embodiment, the antenna device 100 is mounted on a semiconductor substrate (not shown at FIG. 1), such as a substrate of a printed circuit board (PCB), with the semiconductor substrate formed to include electronic components (e.g., transistors, capacitors, resistors, and the like) connected to form circuits, with the circuits further connected to the antenna device 100. In particular, the antenna device 100 can be connected in one of two different configurations: a transmit configuration, wherein the antenna device 100 is connected to transmit electrical signals received from its connected circuits, and a receive configuration, wherein the antenna device is connected to receive electrical signals wirelessly and provide those electrical signals to its connected circuits. In other embodiments, the antenna device 100 can be integrated with an integrated circuit die including the above-referenced circuits, or integrated with an integrated circuit package including one or more integrated circuit dies including the above-referenced circuits.

In the illustrated example of FIG. 1, the antenna device 100 includes a patch antenna 102 and a pair of leads 120 and 121. In this particular example, the patch antenna 102 is of a substantially rectangular shape that is substantially symmetrical about a centerline 114 along a height of the patch antenna 102, and substantially symmetrical about a centerline 112 along a width of the patch antenna 102. In other embodiments the patch antenna 102 can have a different shape, such as a circular shape, an elliptical shape, a square shape, and the like. The patch antenna 102 may be formed from any of a number of metals, such as gold, silver, or copper, or combinations thereof, and may be mounted above or below a semiconductor substrate, such as a radio frequency (RF) substrate, in which components of circuitry connected to the patch antenna 102 are formed, as described further below. The patch antenna 102 is connected to a plurality of vias (e.g., vias 104, 105, and 106) that connect the patch antenna 102 to a ground reference 110 (e.g., a ground plane). In at least one embodiment, the vias 104-106 provide an electrical path through the semiconductor substrate to a ground plane below or above the substrate, the ground plane providing the ground reference 110. The vias can be thru-silicon vias (TSVs) formed of a metal such as copper by etching holes in one or more semiconductor layers below the patch antenna 102 and electroplating copper to fill the holes. The electrical path to the ground reference 110 reduces the buildup of electrical charge on the patch antenna 102, thereby reducing the likelihood of ESD at the antenna device 100.

The vias 104-106 are distributed with their centers along the centerline 112, and are distributed symmetrically around the centerline 114. This symmetrical distribution of the vias 104-106 around a centerline of the patch antenna can assist in the reduction of charge buildup in all regions of the patch antenna 102, providing additional protection against ESD. For example, the symmetrical distribution can ensure that the buildup and corresponding discharge of charge is evenly distributed throughout the patch antenna 102, thereby reducing the likelihood of ESD resulting from an imbalance of charge. It will be appreciated that in at least one embodiment the patch antenna 102 can include additional vias distributed along the centerline 112, along the centerline 114, or both. Further, in at least one embodiment the patch antenna 102 can be connected to the ground reference 110 via fewer or more vias than in the illustrated example of FIG. 1. In some embodiments, the vias 104-106 may be distributed symmetrically about the centerline 112, but distributed asymmetrically about the centerline 114.

The pair of leads 120 and 121 can be integrated circuit package leads, transmission lines incorporated in redistribution layers (e.g., copper layers) of an integrated circuit, ball grid array connections, and the like, or a combination thereof. The leads 120 and 121 provide connections to one or more circuits, such as a circuit incorporated into the semiconductor substrate below the patch antenna 102 or formed or mounted elsewhere on a PCB upon antenna device 100 is mounted. The pair of leads 120 and 121 can be formed of the same metal as the patch antenna 102, such as silver, gold, or copper. In at least one embodiment, when the antenna device 100 is connected in a transmit configuration, the leads 120 and 121 are connected to form the terminals of a differential input to the patch antenna 102. That is, the leads 120 and 121 can be connected to receive a differential input signal, such as extremely high frequency (EHF) input signal.

Figure 2:
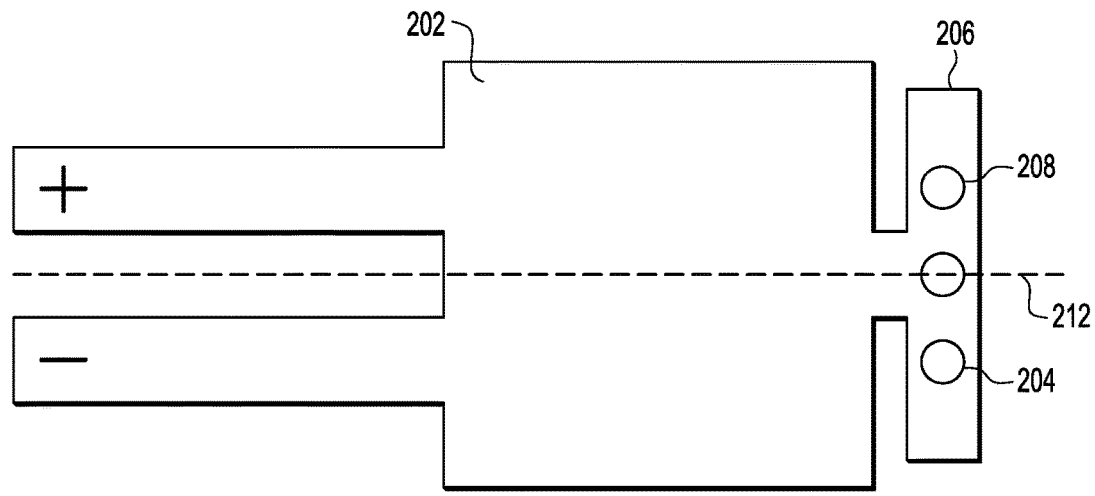
FIG. 2 is a block diagram of an antenna device including a plurality of vias distributed along a perimeter of the patch antenna in accordance with at least one embodiment.

FIG. 2 illustrates a block diagram of a top view of an antenna device 200 in accordance with at least one embodiment. The antenna device 200 is similar to the antenna device 100 in that it includes a metal patch antenna 202 having a substantially rectangular shape that is symmetrical about a centerline 212 along a width of the rectangle. However, in contrast to the antenna device 100, the patch antenna 202 has vias (e.g., vias 204-207) distributed in a metal region 206 having a generally rectangular shape that runs along one side of the patch antenna 202. The vias of the patch antenna 202, such as vias 204 and 208 are symmetrical about at least the centerline 212. This symmetry with the vias connected to the ground reference, along with the differential input/output signal configuration, can provide good charge reduction properties for the patch antenna 202, thereby reducing the likelihood of ESD without degrading the antenna performance.

Figure 3:
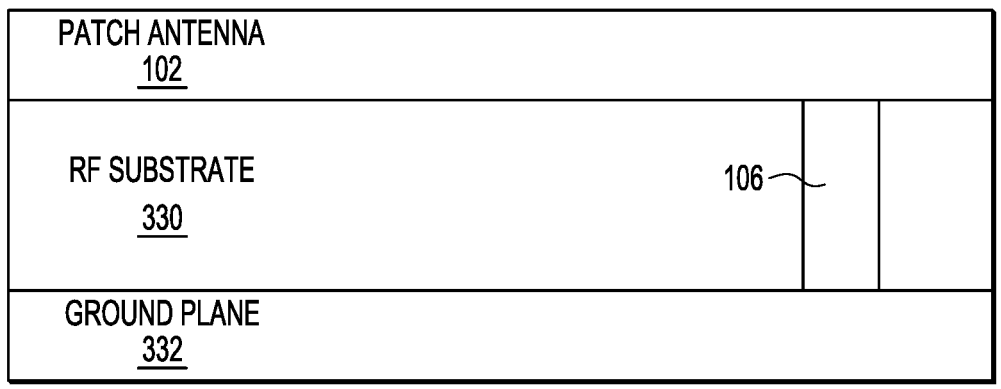
FIG. 3 is a block diagram illustrating a cross-section of an integrated circuit device including the antenna device of FIG. 1 in accordance with at least one embodiment.

FIG. 3 illustrates a cross-section of an integrated circuit device 300 including the patch antenna 102 of FIG. 1 in accordance with at least one embodiment. In the depicted example, the integrated circuit device includes a ground plane 332. In at least one embodiment, the ground plane 332 is a layer of a printed circuit board (PCB) that provides a ground reference for multiple circuits and components of the integrated circuit device 300. The ground plane may be formed of copper foil or other metal and connected to a ground terminal of a power supply (not shown) for the integrated circuit device 300.

A radio frequency (RF) substrate 330 is formed on top of the ground plane 332. The RF substrate 330 can be formed of any of a variety of materials, such as polytetrafluoroethylene (PTFE), epoxy glass laminate (e.g., FR-4), RF-35, gallium arsenide, silicon-on-sapphire, high-resistive silicon-on-insulator (HR-SOI), and the like. The RF substrate 330 can be formed to include one or more components of circuits connected to the patch antenna 102, such as components of transmitter or receiver circuits. In addition, the RF substrate 330 is formed to include vias, such as via 106, connected to the ground plane 332. The patch antenna 102 is mounted on the RF substrate 330 so that the via 106 provides an electrical connection between the ground plane 332 and the patch antenna 102.

Figure 4:
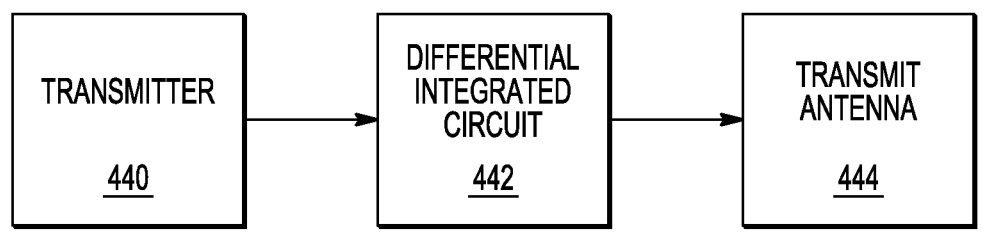
FIG. 4 is a block diagram of a transceiver device including the antenna device of FIG. 1 in accordance with at least one embodiment.
Figure 4:
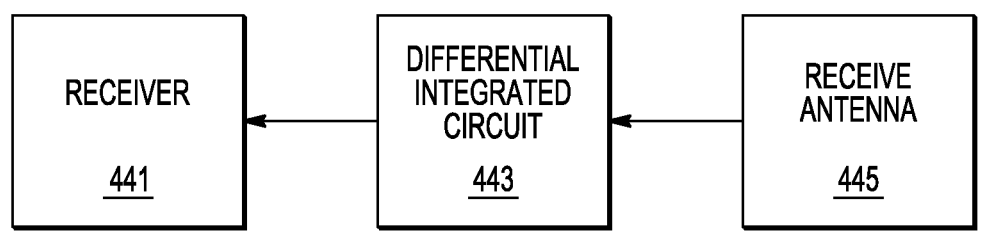

FIG. 4 illustrates a block diagram of a transceiver 400 in accordance with at least one embodiment. The transceiver 400 is a wireless communication module that can be employed in any of a variety of electronic devices, such as a radar system, global positioning system (GPS) device, wireless router, computer, tablet, smartphone, game console, and the like. The transceiver 400 includes a transmitter 440, a receiver 441, differential integrated circuits 442 and 443, a transmit antenna 444 and a receive antenna 445. The transmit antenna 444 and receive antenna 445 are each formed and configured in similar fashion to the antenna device 100 of FIG. 1 or the antenna device 200 of FIG. 2. In particular, the transmit antenna 444 and receive antenna 445 each include a patch antenna that is connected to a ground reference (e.g. a ground plane) via a set of one or more vias, thereby reducing the likelihood of ESD.

The transmitter 440 includes circuitry generally configured to generate electrical signals for transmission based on messages or commands received from a processor or other source (not shown). The transmitter 440 may provide physical (PHY) layer functions to generate the electrical signals based on the commands. The transmitter 440 provides the electrical signals to the differential integrated circuit 442, which generates, based on the electrical signals, one or more differential signals to drive the transmit antenna 444.

The receive antenna 445 receives wireless electrical signals, such as electrical signals transmitted over-the-air. The receive antenna provides these signals to the differential integrated circuit 443, which generates one or more differential signals based on the received electrical signals. The receiver 441 receives the differential signals, and based on these signals and a specified wireless communication protocol, identifies information embedded in the electrical signals received by the receive antenna 445. The receiver 441 can provide the identified information to a processor or other destination (not shown).

Figure 5:
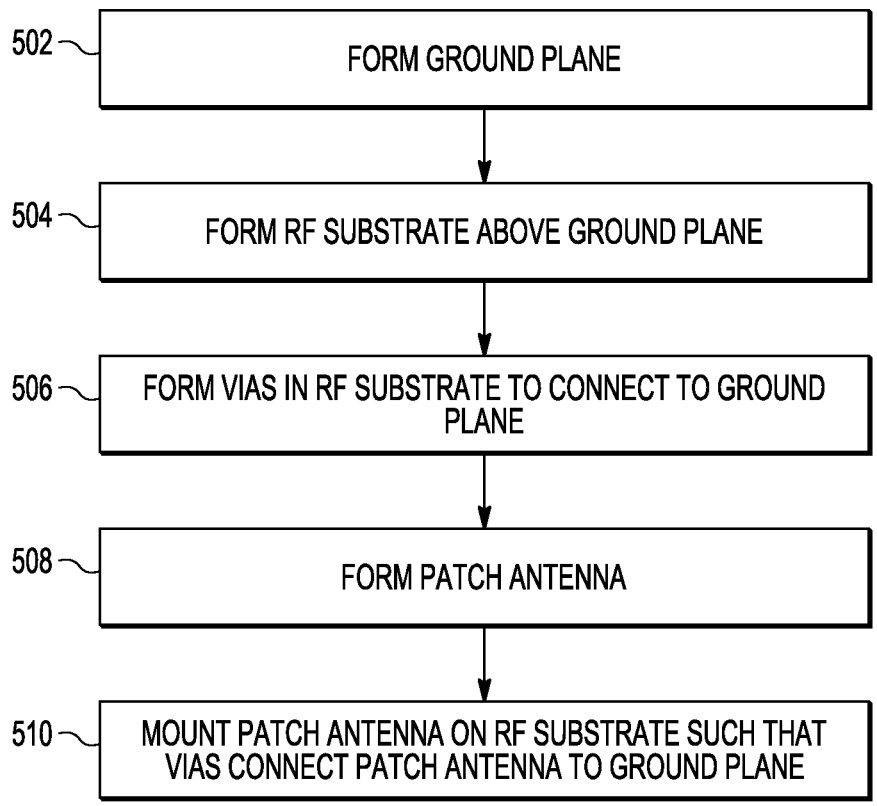
FIG. 5 is a block diagram of a method of forming an integrated circuit device including an antenna having a plurality of vias connected to a ground reference in accordance with at least one embodiment.

FIG. 5 illustrates a flow diagram of a method 500 of forming a semiconductor device including an antenna connected to a ground reference in accordance with at least one embodiment. At block 502, a ground plane is formed, such as by mounting a metal sheet on a printed circuit board and connecting the metal sheet to a terminal for connection to the ground terminal of a power supply. At block 504, an RF substrate is formed over the ground plane according to any of a variety of known substrate formation techniques. At block 506, vias are formed in the RF substrate and the RF substrate is placed over the ground plane so that the vias form an electrical connection with the ground plane. At block 508 a patch antenna is formed. The patch antenna can be formed from copper, silver, gold, or other metal to have a generally rectangular shape. At block 510 the patch antenna is mounted on the RF substrate according to any of a number of knows mounting techniques. The RF substrate is mounted so that the vias through the RF substrate provide an electrical connection between the patch antenna and the ground plane, thereby reducing the likelihood of the ESD at the patch antenna.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. An antenna comprising:
a metal patch comprising a metal region on one side of a first centerline of the metal patch;
a ground plane; and
a plurality of vias, each of the plurality of vias connected to the ground plane and wherein the plurality of vias is disposed only in the metal region and symmetrically about a second centerline of the metal patch.

2. The antenna of claim 1, wherein:
at least one of the plurality of vias is distributed along the second centerline of the metal patch.

3. The antenna of claim 1, wherein:
the metal patch comprises a pair of leads to receive a differential input signal.

4. The antenna of claim 3, wherein:
the differential input signal comprises an Extremely High Frequency (EHF) signal.

5. The antenna of claim 1, wherein:
the plurality of vias includes at least three vias.

6. A device, comprising:
a wireless communication module; and
an antenna coupled to the wireless communication module, the antenna comprising:
a metal patch comprising a metal region on one side of a first centerline of the metal patch;
a ground plane; and
a plurality of vias, each of the plurality of vias connected to the ground plane and wherein the plurality of vias is disposed only in the metal region and symmetrically about a second centerline of the metal patch.

7. The device of claim 6, wherein:
at least one of the plurality of vias is distributed along the second centerline of the metal patch.

8. The device of claim 6, further comprising:
a radio frequency (RF) substrate disposed between the metal patch and the ground plane.

9. The device of claim 8, wherein:
the RF substrate comprises at least a portion of circuitry of the wireless communication module.

10. The device of claim 9, further comprising:
a printed circuit board (PCB) comprising a plurality of layers including a first layer comprising the metal patch, a second layer comprising the RF substrate, and a third layer comprising the ground plane.

11. A method of forming a semiconductor device, comprising:
forming a ground plane:
forming a metal patch above the ground plane, comprising a metal region on one side of a first centerline of the metal patch; and
forming a plurality of vias to couple the metal patch to the ground plane, each of the plurality of vias connected to the ground plane and wherein the plurality of vias is disposed only in the metal region and symmetrically about a second centerline of the metal patch.

* * * * *